United States Patent
Gard et al.

(10) Patent No.: US 6,463,584 B1
(45) Date of Patent: Oct. 8, 2002

(54) STATE COPYING METHOD FOR SOFTWARE UPDATE

(75) Inventors: Bengt Erik Ingemar Gard, Tullinge; Lars-Örjan Kling, Södertäje; Sten Edvard Johnsson, Farsta, all of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/265,965

(22) Filed: Mar. 11, 1999

(30) Foreign Application Priority Data

Mar. 12, 1998 (DE) .......................... 198 10 814

(51) Int. Cl.[7] ................................. G06F 9/44
(52) U.S. Cl. ................... 717/171; 709/215; 370/396
(58) Field of Search ................. 717/1, 11, 100, 717/168, 169–178; 709/202, 221, 215; 711/162; 370/438, 396

(56) References Cited

U.S. PATENT DOCUMENTS

| 4,837,785 A | * 6/1989 | McAlpine ............... 370/438 |
| 5,008,814 A | 4/1991 | Mathur ................ 709/221 |
| 5,155,837 A | 10/1992 | Liu et al. .............. 709/221 |
| 5,455,932 A | * 10/1995 | Major et al. ............. 711/162 |
| 5,699,275 A | * 12/1997 | Beasley et al. ........... 709/221 |
| 5,852,735 A | 12/1998 | Urban ................. 717/171 |
| 6,018,567 A | * 1/2000 | Dulman ............... 379/32.03 |
| 6,049,819 A | * 4/2000 | Buckle et al. ........... 709/202 |
| 6,101,327 A | * 8/2000 | Holte-Rost et al. ....... 717/170 |

FOREIGN PATENT DOCUMENTS

| DE | 4429 969 | 2/1996 | .......... G06F/9/445 |
| EP | 201 281 | 12/1986 | .......... H03H/21/00 |
| WO | 94/01819 | 1/1994 | .......... G06F/9/445 |
| WO | 9618146 | * 6/1996 | .......... G06F/9/445 |

* cited by examiner

*Primary Examiner*—Gregory Morse
*Assistant Examiner*—Hoang-Vu Antony Nguyen-Ba
(74) *Attorney, Agent, or Firm*—Burns, Doane, Swecker & Mathis, L.L.P.

(57) ABSTRACT

To provide an approach to software update with scaleable disturbance there is proposed a state copying method for a computation system with at least two logic partitions wherein a state of new software in a standby partition is updated to the state of old software in an executing partition while continuing execution of the old software. Data is transferred from the executing partition to the standby partition in a scaleable way and as soon as the same state is achieved for the standby partition and the executing partition the execution is switched to the new, software. This provides a scaleable degree of disturbance due to the software update.

29 Claims, 10 Drawing Sheets

EXECUTING MEMORY PARTITION

STANDBY MEMORY PARTITION - COPY DATA

EXECUTING MEMORY PARTITION

STANDBY MEMORY PARTITION - COPY INITIALIZE

STATE COPYING METHOD FOR SOFTWARE UPDATE

This application priority under 35 U.S.C. §§119 and/or 365 to 198 10 814.1 filed in Federal Republic of Germany on Mar. 12, 1998; the entire content of which is hereby incorporated by reference.

BACKGROUND

The present invention relates to the field of software update, and in particular to the field of function change in computer based systems with frequent updating due to newly inserted functionality and/or correction of faults.

The evolution of data processing equipment and software technology leads to an increasing demand for methodologies to update installed software.

The usual methodology to achieve this goal is to stop the execution of the installed software, load the new software and then start the new software. Using this approach, no internal data is transferred between the old and the new software. Also, with this method all the established services are lost and the service is completely stopped during the load and start of the new software. Currently, this method is typically used for, e.g., work stations or personal computers.

Another approach to the problem of software update has previously been described in EP-A-0 201 281. However, this solution does not allow any disturbance free data update function since any necessary data and message conversion is performed through the newly installed software itself during startup.

Further, in U.S. Pat. No. 5,155,837 it is proposed to switch the input of data for new services to the new software in a first step. Further, when the service in progress in the old software is completed, the output of data from the services is switched from the old version to the new version. However, this solution may only handle software that handles services with a very short duration since the software according to the old version must first be finished before the new software version is fully operative.

Therefore, In all known approaches there is some kind of disturbance to the operation of a system in case a software update is performed. This disturbance can range from a total system shutdown during hours or possibly days to a short disruption, possibly only with respect to some limited parts of the total system functionality during a few seconds. Conceivably, there may be no disturbance at all, although this is usually not the case in real existing systems like, e.g., telecommunication exchanges.

SUMMARY

In view of the above, an object of the invention is to provide an approach to software update that may be performed with minimum disturbance and scaleable down to virtually no disturbance at all.

According to the present invention, this object is achieved through a software processing device of the type with update functionality, comprising memory means subdivided into an executing memory partition means storing a first group of software modules and related data, and a standby memory partition means storing a second group of software modules and related data; update control means adapted to update a state of new software in the standby memory partition means to the state of old software in the executing memory partition means during continuation of execution of the old software; and transfer means for scaleable transfer of data from the executing memory partition means to the standby memory partition means.

Therefore, the system to be upgraded is divided into two logical partitions. These partitions may but must not be implemented using a processor pair. Here, according to the invention, one partition referred to as the executive partition contains the old software that performs ordinary execution. Further, the new software is loaded into the other partition referred to as standby partition without disturbing the execution of the executing software. The software in the standby partition is updated to the same state as the software in the executing partition so that the new software in the standby partition can take over the ordinary program execution without any disturbance. Here, this is performed by copying data from the executing partition. Since the old software and the new software are not identical, data may have to be converted into a representation suitable for the new software. According to the present invention, this is performed parallel with and without disturbing the ordinary software execution continuing in the executing partition.

Also, in case it is impractical to transfer all data of the old software according to the present invention, it is possible to partly transfer data from the old software. This allows to scale the degree of disturbance caused through the software update in the system.

According to a preferred embodiment of the present invention the update control means further comprises a switching means and a state comparison means to switch to the execution of new software as far as the same state is detected for the standby partition and the executing partition by the state comparison means.

Thus, according to the present invention, the switch over from the old, software to the new software requires that the complete. state as represented in all data of the old software is copied and, if necessary, simultaneously converted, to the new software. Thus according to the present invention it is possible to continue execution of the new software with no disturbance at all. Further, in case there exist data between programs in the old software that is not processed at the time of switch over it may be copied and, if necessary, converted before the start of the new software.

According to a preferred embodiment of the present invention to each memory partition there is assigned at least one take over means to carry out default actions in case data related to old software is only partly transferred such that special take over means is activated immediately after switch over.

Here, the special takeover means are activated immediately following the, switch over and perform default actions which do not require a complete input of data. While in this case there may be some disturbance to the extent how much data from the old software is missing according to the present invention it may be scaled according to what is deemed suitable through the incorporation of default actions.

According to yet another preferred embodiment of the present invention the update control means instructs continuation of the old software in the executing partition in case an error situation occurs before switch over or performs a switch back so that the partition with the old software becomes again the executive partition in case an error during execution of the new software occurs after switch over.

Here, in case an error situation occurs before switch over the upgrade of the software is terminated and the ordinary software execution continues with the old software in the executing partition. To the contrary, in case of an error during the execution of the new software after switch over a switch back is performed so that the partition containing the old software becomes the executive partition again. Here, the switch back procedure may include data copy, if necessary convert, in the same way as the switch over procedure. Therefore, the switch back procedure, too, may be performed with limited or no disturbance. Alternatively, it may be performed without any data copy and conversion through running a recovery procedure which typically will lead to some disturbance.

Further, according to the present invention the object outlined above is also achieved with a state copying method for a computation system with at least two logic partitions, comprising the steps updating a state of new software in a standby partition means to the state of old software in an executing partition means while continuing execution of the old software, switching to the execution of new software as far as the same state is achieved for the standby partition and the executing partition.

Therefore, using the method according to the present invention, it is possible to achieve a highly efficient and disturbance free update of software even also if there is old software that handles services with long duration present.

According to a preferred embodiment of the inventive method the updating step further comprises an initialization substep executed parallel to and without disturbance of the old software running in the executing partition.

Therefore, the updating of the new software is eventually followed by initialization routines. Although this may be partly done earlier, e.g., immediately after loading of the new software, part of this initialization may be dependent on data from the old software and therefore may not be performed in advance. The initialization of the new software is executed in parallel with minimum disturbance of the ordinary software execution being continued in the executing partition. As the state of the executing partition is continuously changed the disturbance free-update process according to the present invention must be performed also continuously in parallel with the initialization.

According to yet another preferred embodiment of the inventive method the updating step is executed repeatedly as background process until switch over to the new software to keep track of the changing state in the executing partition. If the complete state as represented and all data of the old software is copied, if necessary converted, to the new software, it is possible to continue execution in the new software with no disturbance at all. In case there are data exchanges between programs in the old software, which have not been processed at the time of the switch over, they also have to be copied and, if necessary, converted.

According to yet another preferred embodiment of the inventive method data related to old software is only partly transferred and a special take over step is executed immediately after switch over to perform default actions not requiring complete input of data. In this case, there may be some disturbance. The extent of this disturbance is dependent on how much of the data from the old software is missing. Advantageously, it can in principle be scaled according to what is deemed suitable.

Further, according to the present invention there is provided a state copying method for a distributed computation environment comprising one main processor and at least one remote processor, composing the steps updating new software into a first/standby memory partition of the remote processor, updating a state of the new software to achieve a match with the state of the main processor while continuing execution of software in the main processor, and switching the execution of software in the remote processor to the new software as soon as a match with the state of the main processor is achieved.

This modified method according to the present invention allows to achieve an update of software modules involving other parts than software modules stored in a specific software processing device.

It also enables the update not only of software but also of hardware. In particular, one could consider switching over the execution of software to another software processing device during the hardware update of a software processing device.

Still further, one could consider a combined update of software and hardware at different software processing devices by first changing the hardware parts and then changing the software parts using the method according to the present invention. Here, not all the components have to be changed at the same time and consequently there is no need for a global restart of the distributed system.

BRIEF DESCRIPTION OF THE DRAWINGS

In the following preferred embodiments of the present invention will be described with respect to the appended drawing in which.

DETAILED DESCRIPTION

Figure 1:
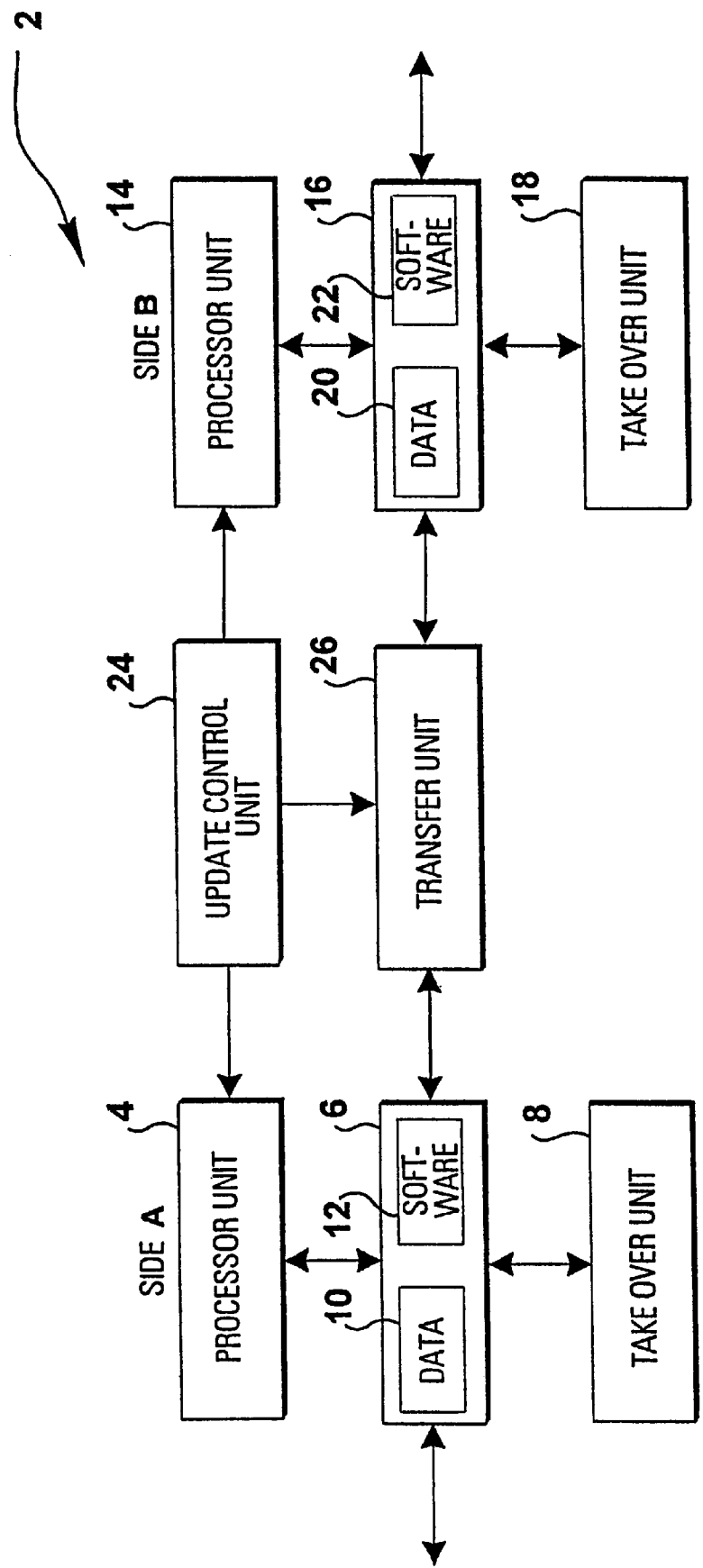
FIG. 1 shows a schematic diagram of the software processing device according to the present invention.

FIG. 1 shows a schematic diagram for an embodiment of the software processing device according to the present invention. Here, the software processing device according to the present invention has two partitions A and B, respectively. For the partition A there is provided a first processor unit 4, a first memory partition 6 and a first take-over unit 8. The first memory partition is divided into a first data storage section 10 and a first software storage section 12.

Further, the same structure is chosen for the B-side comprising a second processor unit 14, a second memory partition 16, and a second takeover unit 18, respectively. As for the A-side, the second memory partition 16 is divided into a second data storage section 20 and a second software storage section 22.

As shown in FIG. 1, to coordinate the update of software between either the side A to the side B or vice versa there is in addition provided an update control unit 24 controlling both processor units 4 and 14 as well as a transfer unit 26 coupling the first memory partition 6 to the second memory partition 16.

As shown in FIG. 1, the first and second takeover units 8 and 18 are assigned to the first and second memory partition 6 and 16, respectively, to carry out default actions in case data related to old software is only partly transferred. In particular, such default actions are related to a new software not requiring a complete input of data and may consist of, e.g., initialization of data variables to a specific value.

As outlined above, this allows that the transfer unit 26 transfers data on a scaleable level since data not transferred may be initialized through the take over units 8 and 18, respectively. Also, the transfer unit 26 either copies data unchanged or after conversion into a new representation for the new software under control of the update control unit 24. Here, the conversion of data may be carried out parallel with and without disturbing the section of old software in the executing partition. Also, the update control unit 24 and the transfer unit 26 are adapted to repeat the data transfer in case the executing software writes data already transferred previously during the further execution of the old software in the execution partition.

Also, the update control unit 24 is adapted to instruct a continuation of the old software in the executing partition in case an error situation occurs before switch over. Another option would be switch back such that the partition with the old software becomes again the executed partition in case an error during execution of the new software occurs after switch over.

Figure 2:
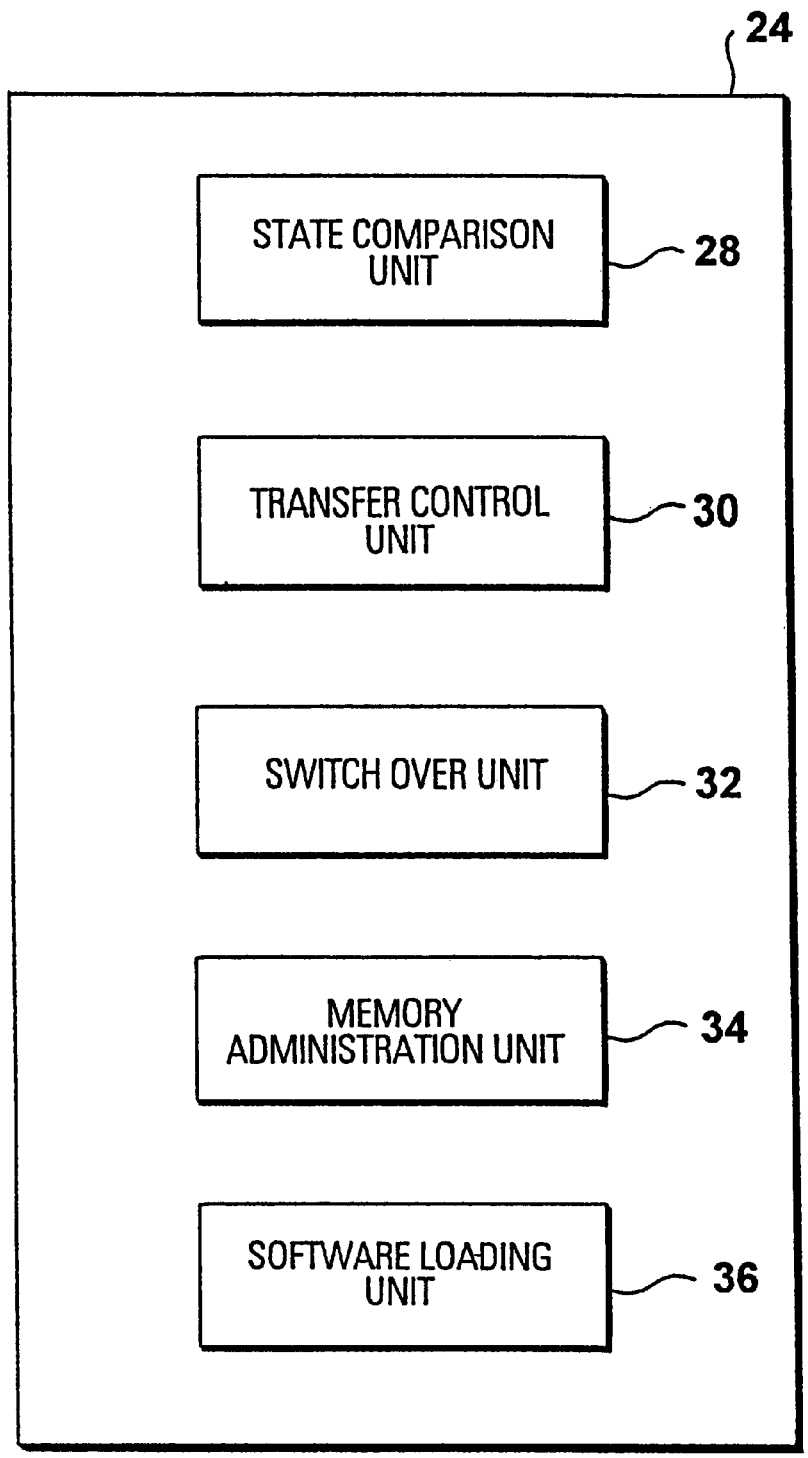
FIG. 2 shows a schematic diagram of the update control unit shown in FIG. 1.

As shown in FIG. 2, the update control unit 24 achieves an update which may be executed in a bi-directional way where either the memory partition 6 and 16 serves as executing partition during the update and the other partition 16, 6 serves as standby partition into which the new software is loaded. During this update process data is transferred from the executing partition to the standby partition via the transfer unit 26 in a scaleable way.

To achieve scalability the update control unit 24 shown in FIG. 1 is structured as shown in FIG. 2. The update control unit 24 comprises a state comparison unit 28, a transfer control unit 30, a switch over unit 32, a memory administration unit 34, and a software loading unit 36, respectively.

The state comparison unit 28 allows to compare the state of data and software in the two memory partitions 6 and 16. Further, the transfer control unit 30 is provided to achieve a scaleable, flexible, transfer of data or software, respectively, between both memory partitions 6 and 16. The switch over unit 32 switches the execution of software between the side A and the side B or vice versa as soon as the state comparison unit 28 detects the same state for the execution partition and the standby partition. The memory administration unit 34 is provided to allocate, deallocate or compact memory in either of the memory partitions 6 and 16 and also to maintain reference information therein. Finally, the software. loading unit 36 serves to load new software into the software storage section 12, 22 of each partition 6, 16.

While above; the basic structure of the software processing device according to the present invention has been described with respect to FIGS. 1 and 2, in the following the functionality of these components as well as their interrelation will be described with respect to FIGS. 3 to 7. While according to the following description the update of software for the B-side is described this is not to be construed as limiting the invention which may be executed also in the reverse direction to the A-side.

Figure 3:
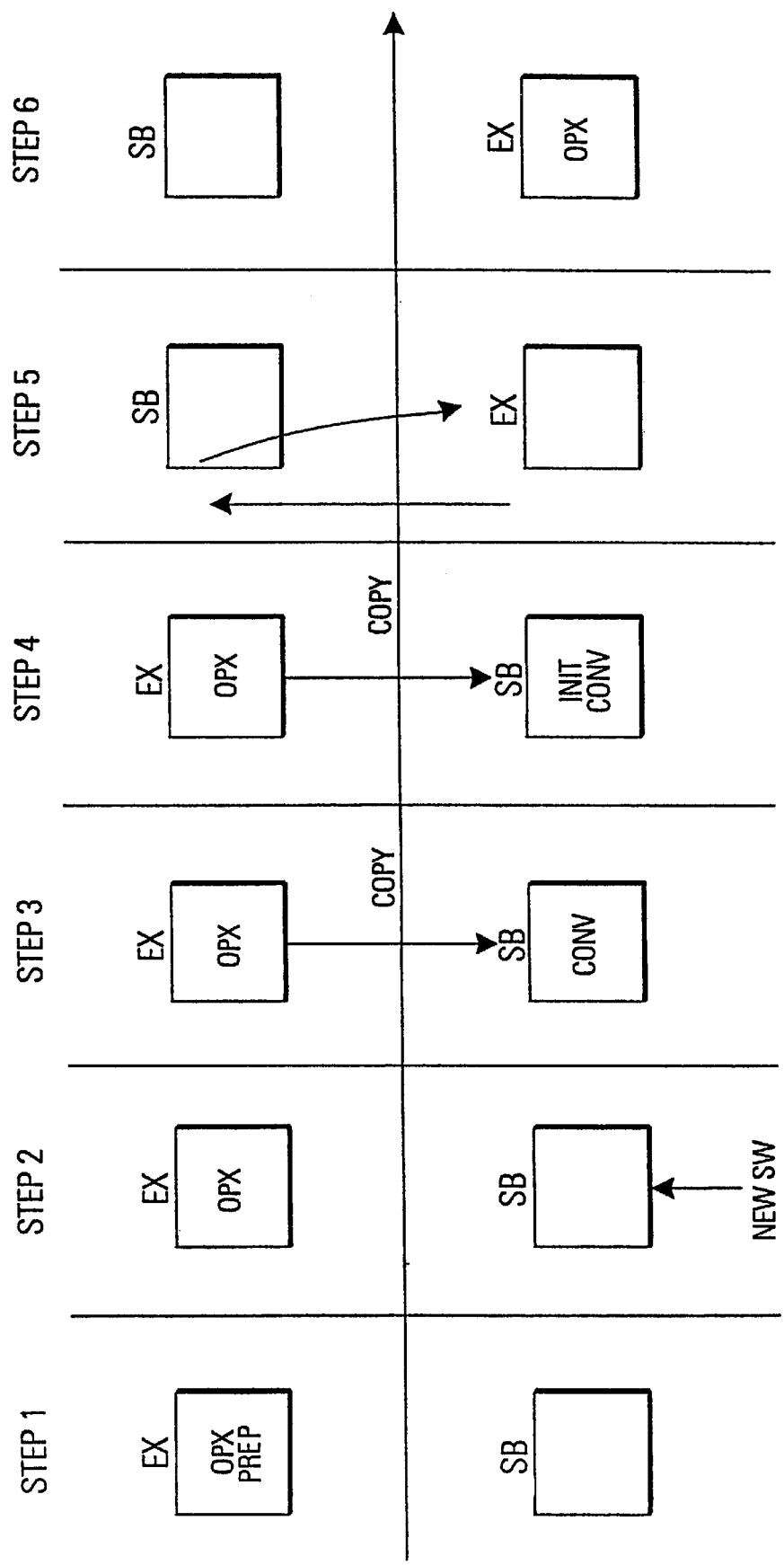
FIG. 3 shows a diagram for the state copying method according to the present invention.

FIG. 3 shows the basic steps underlying the execution of the state copying method according to the present invention. As shown in FIG. 3 in a step 1 both partitions are executing a parallel synchronous modus and execute, e.g., the same software.

Further, step 2 shown in FIG. 3 relates to the loading of new software in the standby partition while the execution of old software in the executing partition is continued. Further, step 3 performs the copying of data from the executing partition to the standby partition. As shown on the lower part being related to this step 3, copy data may also be converted in the standby partition into a representation suited for the new software. Here, the copying and conversion of data is executed parallel with and without disturbing the execution of old software in the executing partition. Also, according to the present invention, the copying and conversion of data may be executed through dedicated software or hardware.

As shown in FIG. 3, in step 4 there is carried out an initialization also executed in parallel to and without disturbance of the old software running the in executing partition. Here, the initialization step is either carried out immediately after loading the new software into the standby partition in step 2 or as soon as possible in case it is dependent on data copied from the old software in step 3.

As already outlined above, data being related to old software may only partly be transferred and special initialization steps are executed before or immediately after switch over to perform default initialization actions not requiring complete input of data from the old software.

As shown in FIG. 3, as soon an appropriate state is achieved in the standby partition step 5 switching to the execution of new software is executed. Here, it should be noted that the switch over may be executed with respect to single software modules immediately after the same state is achieved for related software modules in both memory partitions. In case there exists data related to old software that is not transferred at the time of switch over due to only a partial transfer of data this data may still be transferred, if necessary, before the start of the new software.

Further, as shown in FIG. 3 with respect to step 3 and step 4 the copying process between the two memory partitions is continued also during the initialization step for the standby partition. The reason for this is that the old software continuously executing during the update process may write to data already being transferred previously. Thus, the update process is executed repeatedly as background process until the switch over to the new software to keep track of the changing state of the executing partition. This repeated updating process may be executed parallel to the initialization step for the standby partition.

Figure 4:
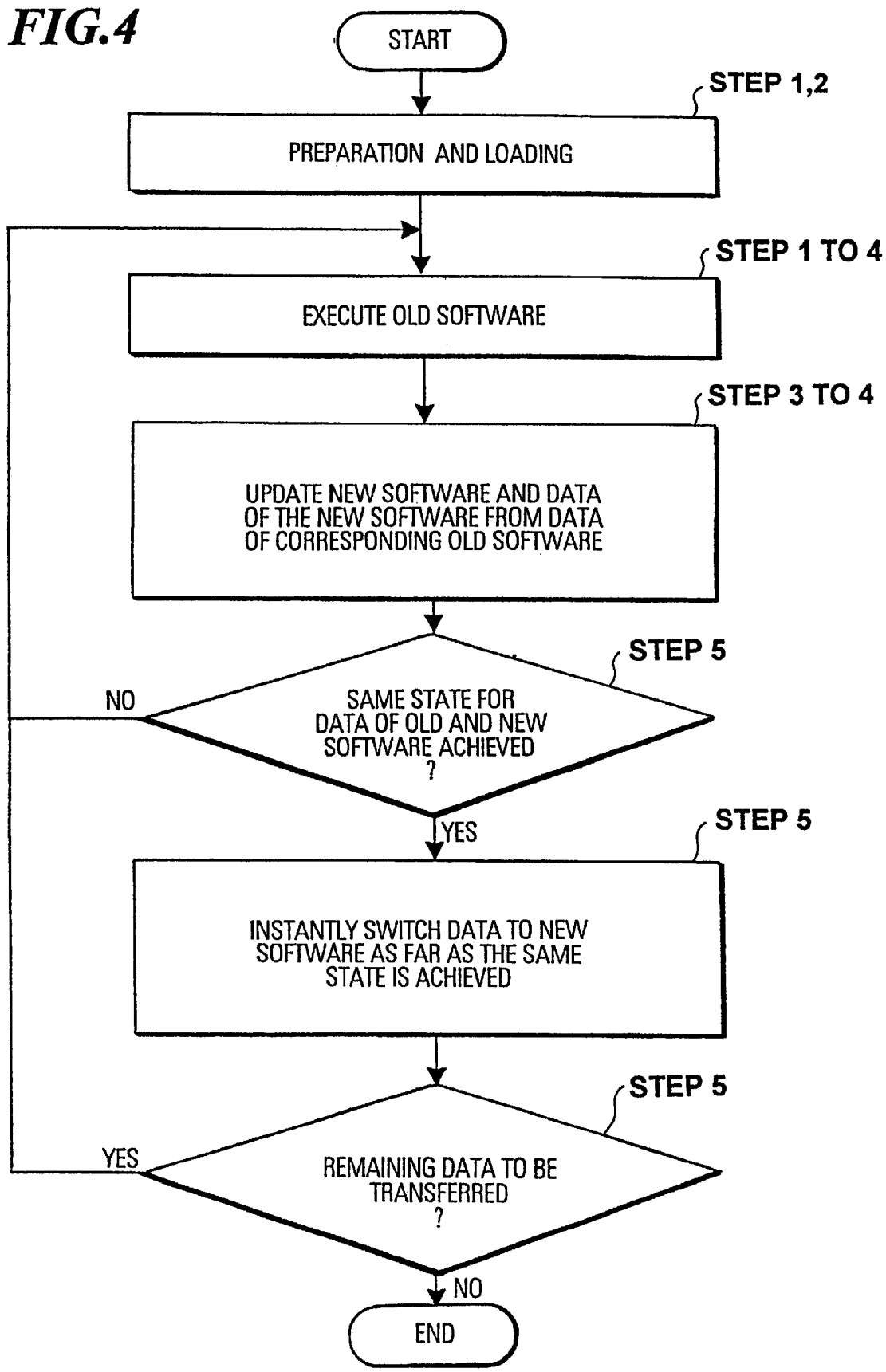
FIG. 4 shows a flowchart according to the state copying method shown in FIG. 3.

FIG. 4 shows a flowchart according to the update process explained with FIG. 3. In particular, it may be seen that after a step 1 and 2 for loading new software and initializing storage being related thereto a background process is continuously repeated until the switch over takes place. Here, it should be noted that the background process may also be implemented through splitting it up into a plurality of background processes. In case the same state is detected for old and new software an instant switch over takes place followed by an interrogation to determine whether data to be transferred remains and thus a loop back to the execution of old software is necessary.

Figure 5:
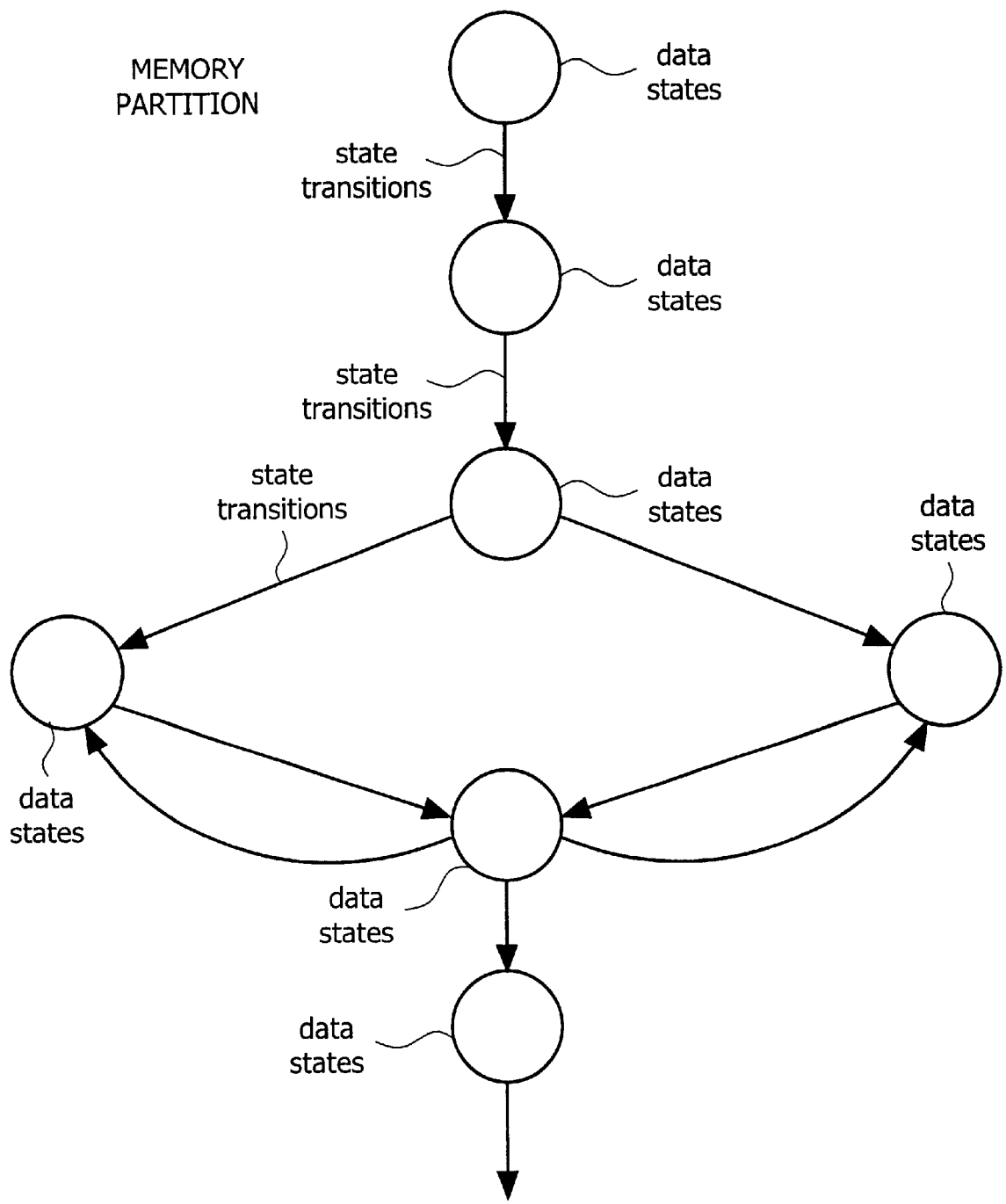
FIG. 5 shows a state diagram to represent the status of one partition in the software processing device.

In the following, a more specific example for the state copying method according to the present invention will be described with respect to FIGS. 5 and 6. FIG. 5 shows the representation of the state of a memory partition using a state graph and FIGS. 6a to 6e show the modification of such a state graph during the state copying method.

As shown in FIG. 5, a state in a memory partition is represented using a state graph comprising nodes and edges, respectively. Here, typically nodes may represent different states of data and edges represent a transfer between different data states through the execution of software modules being assigned to the edges. One example would be that the utmost node relates to input data which is transferred to data suitable for further processing by an input data processing software module. Also, nodes having two edges running therebetween represent the interaction of two software modules where output data of one software module represents input data to the other software module and vice versa.

As shown in FIG. 6, this representation is well suited to represent the different steps shown in FIG. 3. In particular, FIG. 6a represents the simultaneous parallel synchronous modus of execution of the same software in the executing and standby partition before the update process starts. Then, as shown in FIG. 6b, during the loading of new software in step 2 the interaction of different software modules represented as edges is interrupted and the loading of new software begins. As shown in FIG. 6b, data may be subdivided into different categories as already outlined above. Here, the black nodes represent data in the new software which should be identically copied from the old software. To the contrary, nodes represented in white are related to data of the new software which do not depend on the data of the old software at all. One typical would be data that is newly introduced due to a modification of data structures. Another category of nodes represented in hatching relates to data requiring conversion to be adapted to the new software. A further differentiation, represented in grey, may be that data is only partially copied or converted from the old software using in addition the takeover mechanism to reduce the amount of data to be transferred to the new partition. Overall, as shown in FIG. 6c only for the last three categories data is copied and converted between the executing and the standby partition.

Figure 6A:
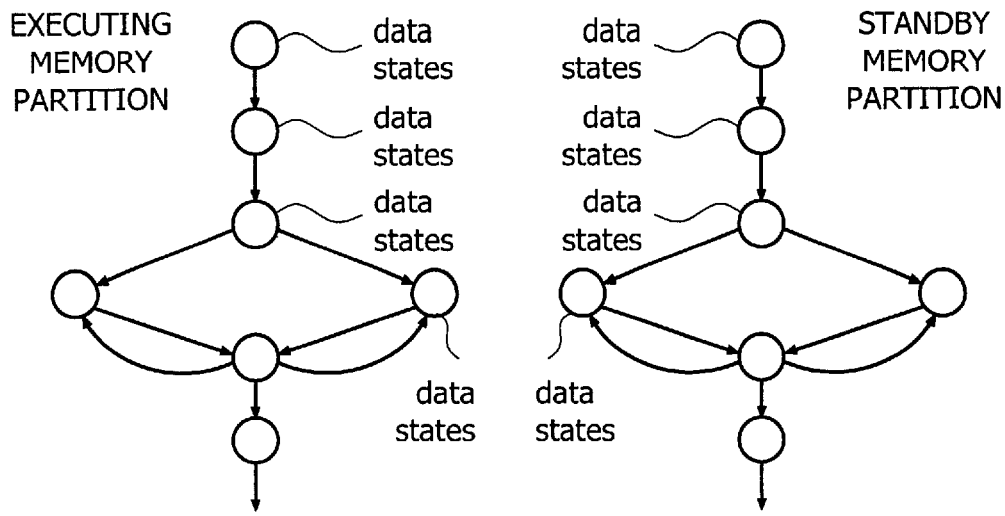
FIG. 6a shows a parallel synchronous modus for execution of software in both partitions according to step 1 shown in FIG. 3.
Figure 6B:
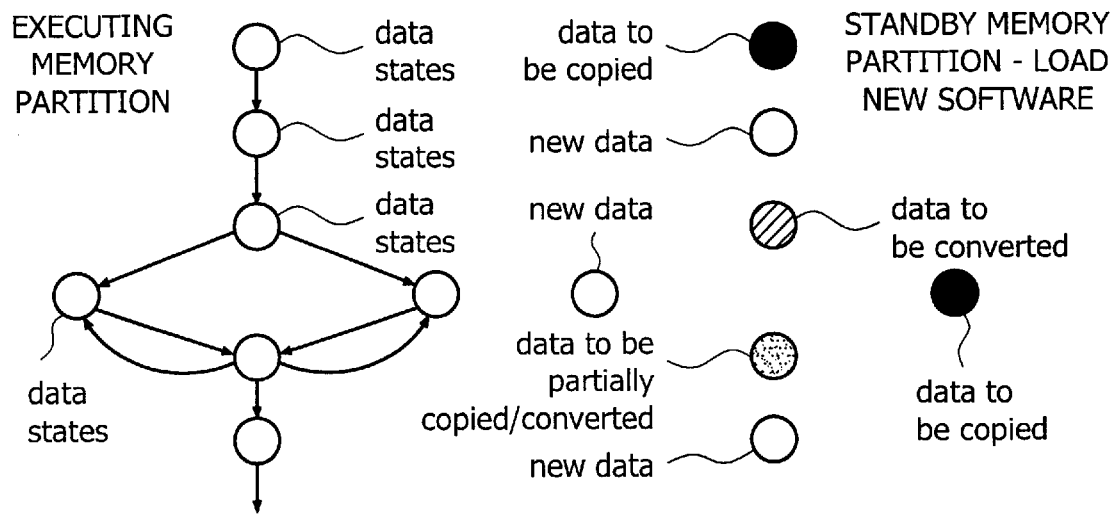
FIG. 6b shows the status in both partitions according to step 2 shown in FIG. 3.
Figure 6C:
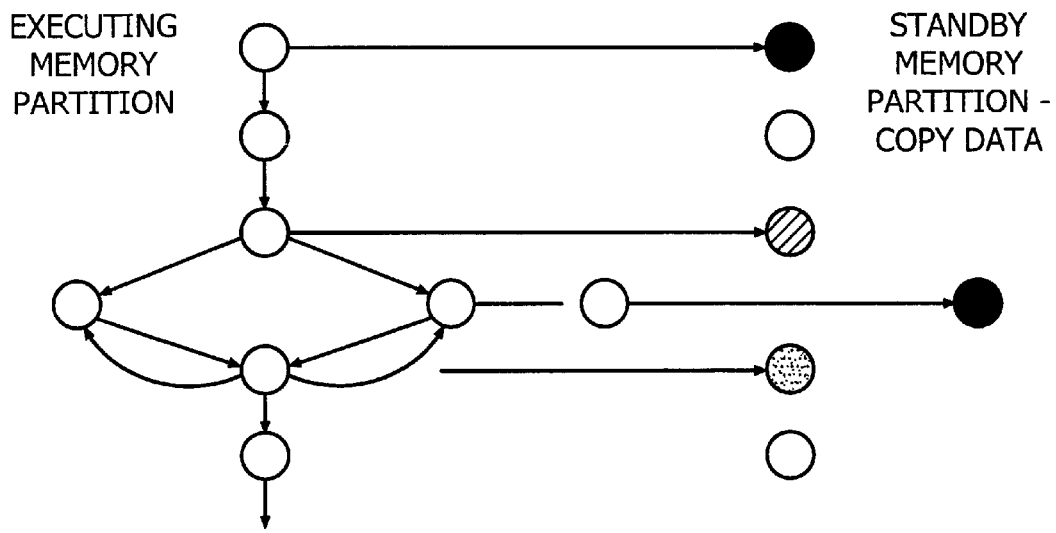
FIG. 6c shows the status in both partitions according to step 3 shown in FIG. 3.
Figure 6D:
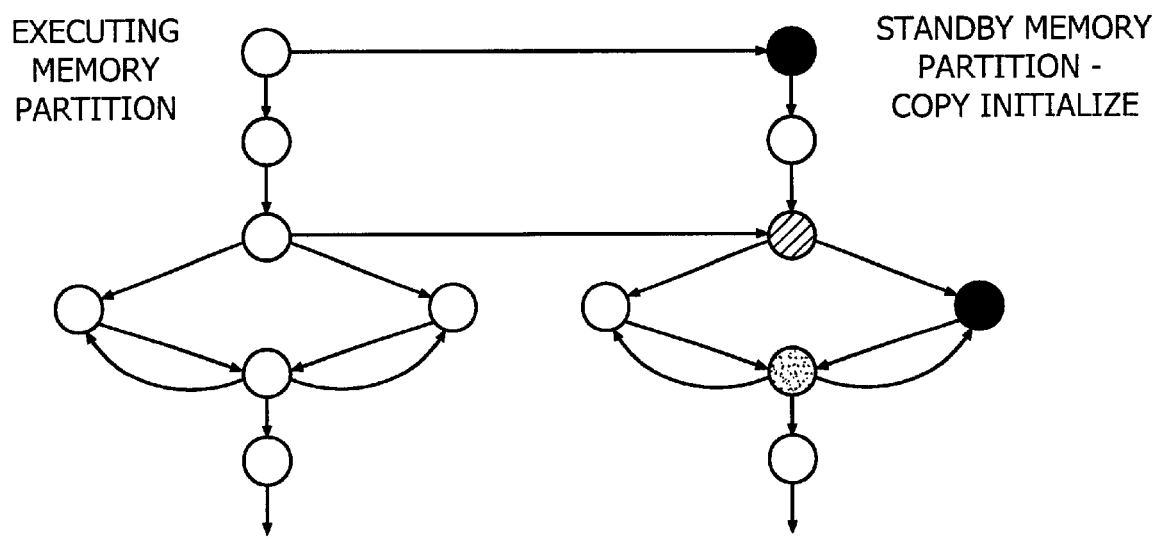
FIG. 6d shows the status in both partitions according to step 4 shown in FIG. 3.
Figure 6E:
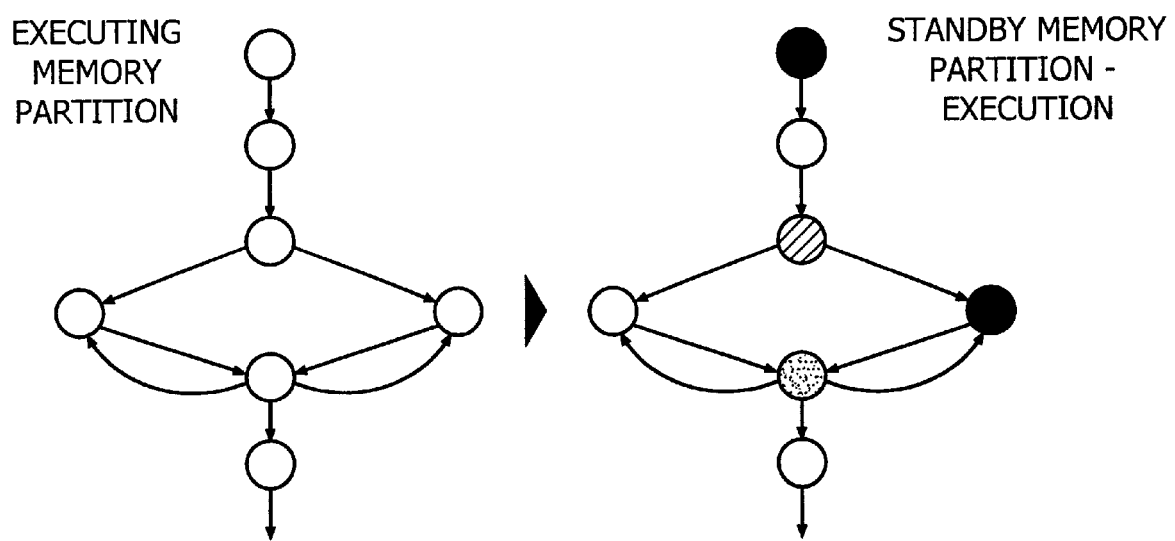
FIG. 6e shows the status in both partitions according to step 5 shown in FIG. 3.

The outcome of step 4 shown in FIG. 3 is represented through FIG. 6d. After initialization of the new software interrelationships of the different data components are again introduced. As already outlined above with respect to FIGS. 3 and 4 the state copying method according to the invention is iterated in case data is rewritten by the old software during the update process. Thus, FIG. 6d shows the situation before the switch over w here the copying/conversion is continued also after the initialization in step 4. After switch over takes place in step 5 these arcs representing the copying/conversion of data are no longer present, as shown in FIG. 6e. After switch over has taken place the status corresponds again to the parallel synchronous modus described above.

Therefore, in the state copying method the status copied from the old software to the new software and eventually the total state is defined in the new as well as in the old version. In principle, the execution can continue in any of the software versions since the state is complete for both versions. Significant for the state copying method is that there is never a concurrent execution of software going on in the executing partition and the standby partition except for the update function itself.

According to the inventive state copying method it is also possible to terminate the update process before the switch over in case an error situation occurs and to continue with the execution of the old software. Also, it is possible to further execute a switch back in case an error occurs during an execution of the new software after switch over so that the old software becomes executed again. This switch back may include data transfer with data copy and convert of the type outlined above.

While in the above, the state copying method of the present invention has been described with respect to a software processing device in the following the application of the state copying method to a distributed computing environment will be described with respect to FIGS. 7 to 12.

Figure 7:
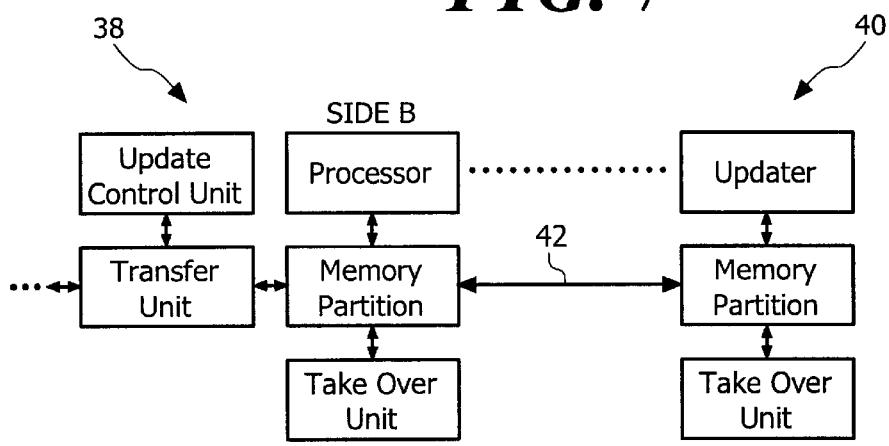
FIG. 7 shows the inventive approach to the update of software in a distributed environment with a remote processor having a preloading capability.
Figure 9:
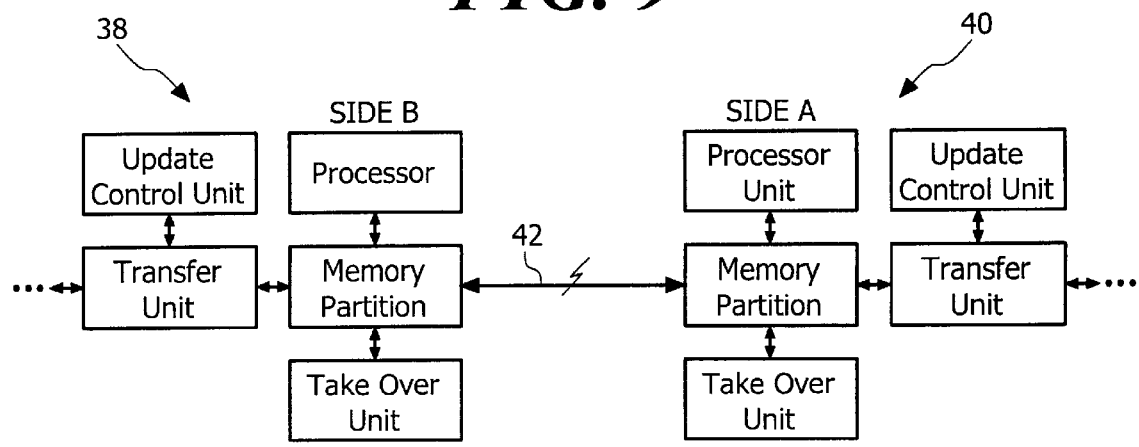
FIG. 9 shows the update of software in a distributed computing environment with a remote processor with an impact on the compatibility of the interface thereto after the software update.

As shown in FIG. 7, the distributed computing environment comprises a main processor 38 and a remote processor 40. Typically, the main processor 38 has the structure shown in FIG. 1 only partially shown in FIG. 7. Further, there is provided a remote processor 40 that at least must have the option to preload software into a memory partition 46 of the remote processor 40. Alternatively, also the remote processor 40 may have the structure of the inventive software processing device, as shown in FIG. 9. The main processor 38 and the remote processor 40 are linked through a connection line 42. Each remote processor is provided with at least one update means 44 coordinating the update in the remote processor 40 and the interaction with the main processor 38.

FIG. 7 now shows the first case to use the inventive state copying method within a distributed computing environment. Here, only software of the remote processor 40 is updated such that the new software is initially preloaded to a memory partition 46 of the remote processor 40. To make the state copying method work two requisites are that the remote processor 40 allows preloading so that service is possible during loading of the new software and that after loading data may be updated from the main processor 38. If this is the case, software may be updated in the remote processor 40 without a global restart of the distributed computing environment. To this end, once the new software is installed in the remote processor 40, the state of the memory partition 46 in the remote processor 40 is updated to the state of the memory partition in the main processor 38 while continuing execution of the software in the main processor 38. Finally, the execution of software in the remote processor 40 switch to the new software as soon as a match with the state of the main processor 38 is achieved.

Further, for the state copying method fast updating of the remote processor 40 may be necessary depending on what type and how much software is updated. Here, in case only non-critical and/or a limited amount of software is updated high updating speed requirements do not prevail. Thus, it may be possible to get updating times consistent with the interruption time for the updating process even when updating a plurality of remote processors.

Figure 8:
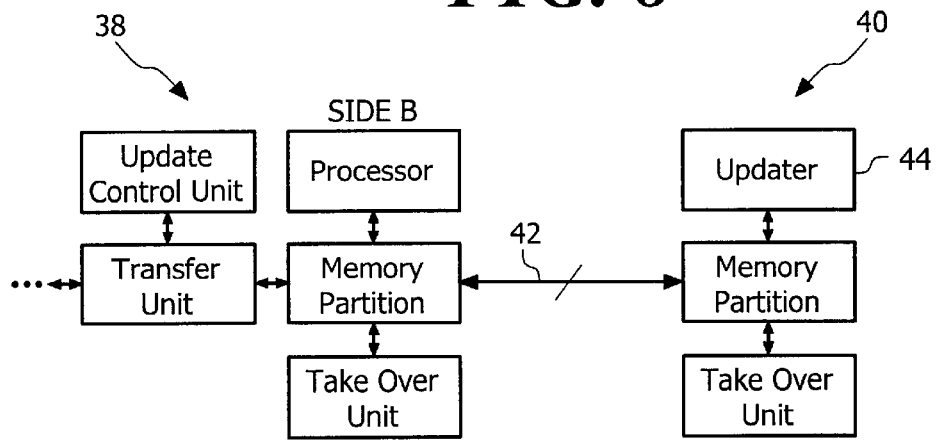
FIG. 8 shows the update of software in a distribute computing environment with a remote processor without impact on the compatibility of the interface thereto after the software update.

FIG. 8 shows a further case where software is updated not only in the remote processor 40 but also in the main processor 38 and where the update process has no impact on the interface compatability. Here, the software update is performed in two steps by first updating the software in the remote processor 40 as outlined above and then updating the software in the main processor 38 using the state copying method described above. In case not all remote processors in the distributed computation environment are updated at the same time there is no need for a global restart in the system.

FIG. 9 relates to the same case as shown in FIG. 8 with the difference that after the update of software in the main processor 38 and the remote processor 40 the interface therebetween is incompatible.

In this case, the remote processor 40, too, should have the same structure as outlined above with respect to FIG. 1 so that a simultaneous update of software in the remote processor 40 and the main processor 38 with a modification of the interface therebetween is achieved through simultaneously executing the inventive state copying method in the main processor 38 and the remote processor 40, respectively.

Here, in case uncritical parts of the distributed computing environment are involved, the state copying method should be used by blocking out the part in the system to be changed, then updating the software simultaneously, and finally deblocking the changed parts in the distributed computation environment again. In case data must be transferred from the old software to new software, the copying/conversion should be done before the start and deblocking of the new software. To the contrary, in case critical parts are involved during the update of software, the remote processor 40 should be preloaded with the new software in order to avoid a too long down time of the distributed computation environment during the update process.

Further options are that the new software in the remote processor 40 is updated with data from the main processor 38. Also, functions to support the transfer of data from old to new software could be introduced for the remote processor 40.

While in the above the update of software in different system configurations has been considered using the inventive state copying method, in the following a combined upgrade of hardware and software will be explained with respect to FIGS. 10 to 12.

Figure 10:
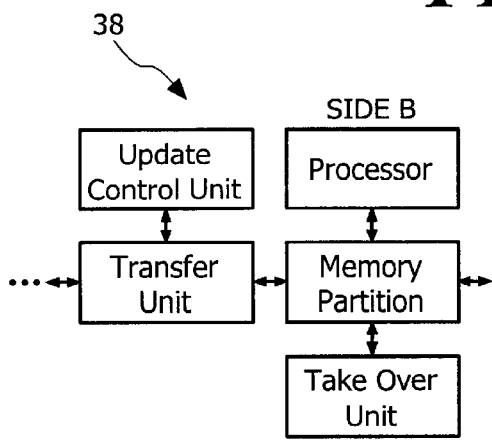
FIG. 10 shows the inventive approach to the update of hardware for a main processor in a distributed computing environment.

FIG. 10 relates to the update of hardware in the main processor 38. Typically, hardware components are exchanged by blocking out the hardware components to be exchanged, then replacing them and finally deblocking them again.

Figure 11:
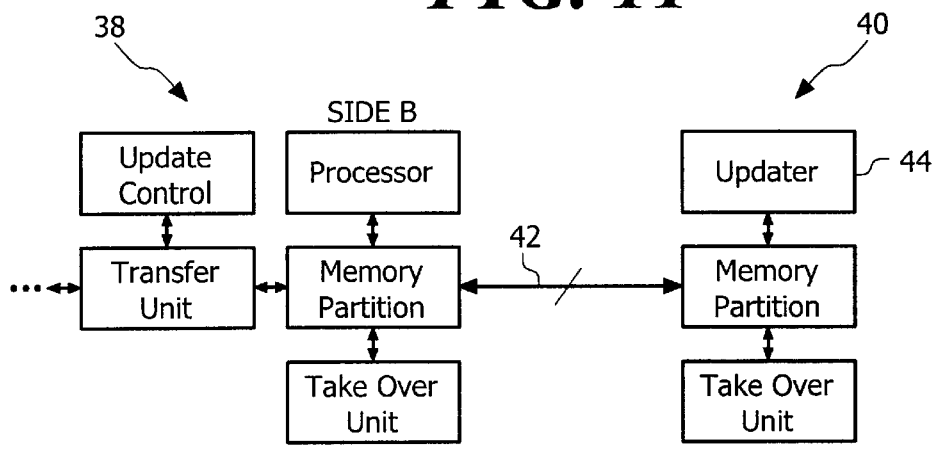
FIG. 11 shows the inventive approach to the update of hardware and software in a remote processor of an distributing computing environment without impact on the compatability of the interface thereto after the update.

FIG. 11 shows the next case where software is updated both in the remote processor 40 and the main processor 38 without any impact on the compatibility of the interface. Further, in the case shown in FIG. 11 also hardware being assigned to the remote processor 40 should be exchanged. Heretofore, other components assigned to the remote processor 40 are first exchanged using the approach described to FIG. 10. Then, the exchange of software both in the remote processor 40 and the main processor 38 is realized using the approach described with respect to FIG. 8.

Figure 12:
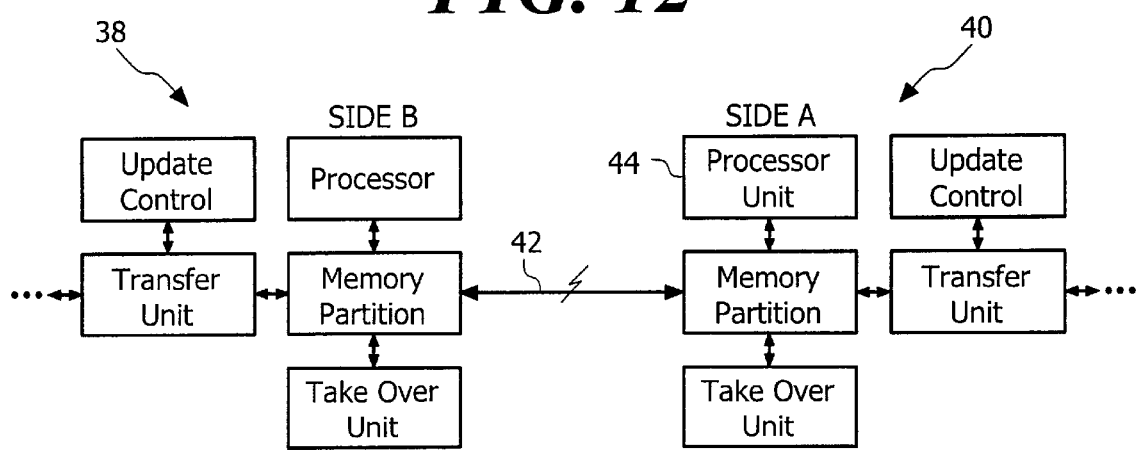
FIG. 12 shows the inventive approach to the update of hardware and software in a remote processor of an distributing computing environment with impact on the compatability of the interface thereto after the update.

FIG. 12 shows a further case for the application of the state copying method where hardware components assigned to the remote processor 40 are exchanged simultaneously with the update of software in the remote processor 40 and the main processor 38 leading to an incomparability for the software after the update. Here, in case the hardware and software change with respect to the remote processor 40 does not lead to an incomparability within the remote processor 40 and with respect to the new hardware and software components, the hardware at the remote processor 40 is first changed and then the software update is executed as outlined above with respect to FIG. 9.

To the contrary, the situation is more complicated if the exchange of; hardware components in the remote processor 40 does also lead to an incompatability with respect to the updated software in the remote processor. Here, in case the change of hardware and software is uncritical with respect to the performance in the distributed computation environment the same approach as described with respect to FIG. 11 could be used.

However, in case this hardware change is critical the respective hardware components should be provided in duplicate at the remote processor 40 and also the software should either be preloaded into the remote processor 40 according to FIGS. 7 and 8 or the remote processor 40 should be partitioned in two sides. Another prerequisite for this case is that,the processing speed of the remote processor 40 is fast enough. If these conditions are fulfilled, it is possible to perform the combined update without excessive system downtime.

List of Reference Numerals

2 Software Processing Device
4 A-Side Processor Unit
6 A-Side Memory Partition
8 A-Side Takeover Unit
10 A-Side Data Storage Section and A-Side Memory Partition
12 A-Side Software Storage Section and A Side Memory Partition
14 B-Side Processor Unit
16 B-Side Memory Partition
18 B-Side Take Over Unit
20 B-Side Data Storage Section and B-Side Memory Partition
22 B-Side Software Storage Section and B-Side Memory Partition
24 Update Control Unit
26 Transfer Unit
28 State Comparison Unit
30 Transfer Control Unit
32 Switch Over Unit
34 Memory Administration Unit
36 Software Loading Unit
38 Main Processor
40 Remote Processor
42 Connection Line
44 Update Means in Remote Processor
46 Memory Partition of Remote Processor

What is claimed is:

1. A software processing device including update functionality, comprising:
   memory means subdivided into an executing memory partition means for storing a first group of software modules and related data, and a standby memory partition means for storing a second group of software modules and related data;
   update control means adapted to update a state of new software in the standby memory partition means to a state of old software in the executing memory partition means during continuation of execution of the old software;

transfer means for scalably transferring data from the executing memory partition means to the standby memory partition means; and switching means and state comparison means to instantly switch to execution of new software gas soon as a same state is detected for the standby memory partition means and the executing memory partition means by the state comparison means.

2. A software processing device according to claim 1, wherein the update control means comprises:

a memory administration means to allocate and deallocate memory sections for the new and old software and data and to maintain reference information therefor; and a transfer control unit to control the transfer means according to instructions for the scalable transfer of data.

3. A software processing device including update functionality, comprising:

memory means subdivided into an executing memory partition means for storing a first group of software modules and related data, and a standby memory partition means for storing a second group of software modules and related data;

update control means adapted to update a state of new software in the standby memory partition means to a state of old software in the executing memory partition means during continuation of execution of the old software; and transfer means for scalably transferring data from the executing memory partition means to the standby memory partition means, wherein each memory partition means is assigned at least one take over means to carry out default actions in case data related to old software is only partly transferred such that the take over means is activated immediately after switch over.

4. A software processing device including update functionality, comprising:

memory-means subdivided into an executing memory partition means for storing a first group of software modules and related data, and a standby memory partition means for storing a second group of software modules and related data;

update control means adapted to update a state of new software in the standby memory partition means to a state of old software in the executing memory partition means during continuation of execution of the old software; and transfer means for scalably transferring data from the executing memory partition means to the standby memory partition means, wherein the transfer means copies data either unchanged or after conversion into a new representation for the new software.

5. A software processing device according to claim 4, wherein the transfer means carries out the conversion of data parallel with and without disturbing the execution of old software in the executing memory partition means.

6. A software processing device according to claim 4, wherein the transfer means comprises a dedicated conversion means.

7. A software processing device including update functionality, comprising:

memory means subdivided into an executing memory partition means for storing a first group of software modules and related data, and a standby memory partition means for storing a second group of software modules and related data;

update control means adapted to update a state of new software in the standby memory partition means to a state of old software in the executing memory partition means during continuation of execution of the old software;

transfer means for scalably transferring data from the executing memory partition means to the standby memory partition means; and switching means for switching between software on the executing memory partition means and the standby memory partition means, wherein the update control means repeatedly updates until the switching means switches to execution of the new software to keep track of a changing state in the executing memory partition means.

8. A software processing device according to claim 7, wherein if data related to the old software is not transferred at the time of switch over the transfer means transfers, if necessary, this data before a start of the new software.

9. A software processing device according to claim 7, wherein the update control means instructs continuation of the old software in the executing memory partition means in case an error situation occurs before switch over.

10. Software processing device according to claim 7, wherein the switching means is adapted to perform a switch back such that the partition with the old software becomes again the executive memory partition means in case an error during execution of the new software occurs after switch over.

11. A distributed computing system including update functionality, comprising:

at least one main processor means selected from a plurality of processors in the distributed computing environment to handle distribution; of processing tasks in the distributed computing environment and interactions of the processors comprised therein; and at least one remote processor means having an update means to update new software into a memory partition of the remote processor means such that a state of the new software matches a state of the main processor means and execution of software in the remote processor means is switched to the new software as soon as the match is achieved, and data is scalably transferred between memory partitions of the processor means.

12. A distributed computing system according to claim 11, wherein:

if an interface between the remote processor means and the main processor means remains compatible after updating the new software into the remote processor means, then the main processor means updates its memory to achieve a combined upgrade of software in the remote processor means and the main processor means.

13. Distributed computing environment according to claim 11, wherein:

if an interface between the remote processor means and the main processor means is incompatible after software update, then the main processor means and the remote processor means update their respective memories and concurrently execute the software update necessary to adapt to a modified interface.

14. A state copying method for a computation system with at least two logic partitions, comprising the steps of:

loading new software into a standby partition means and updating a state of the new software in the standby partition means to a state of old software in an executing partition means while continuing execution of the old software;

scalably transferring data from the executing partition means to the standby partition means; and switching to execution of new software as far as a same state is achieved for the standby partition means and the executing partition means.

15. A state copying method according to claim 14, wherein a transfer of data from the executing partition means to the standby partition means comprises the steps of:

copying of data transferred unchanged; and converting data into a new representation for the new software.

16. A state copying method according to claim 15, wherein the conversion of data is done without disturbing the execution of old software in the executing partition means.

17. A state copying method according to claim 15, wherein the conversion of data is executed through a. dedicated conversion step.

18. A state copying method according to claim 14, wherein if data related to the old software is not transferred at the time of switch over, then this data is transferred, if necessary, before a start of the new software.

19. A state copying method according to claim 14, wherein data related to old software is only partly transferred and a special take over step is executed immediately after switch over to perform default actions not requiring complete input of data.

20. A state copying method according to claim 14, wherein if an error occurs before switch over then an update is terminated and the execution of the old software in the execution partition means is continued.

21. A state copying method according to claim 14, wherein a switch back step is performed such that the partition means with the old software becomes the executing partition means in case an error during execution of the new software occurs after switch over.

22. A state copying method according to claim 21, wherein the switch back includes a data transfer with data copy and convert, if necessary, performed with limited or no disturbance.

23. A state copying method according to claim 22, wherein the switch back step includes a recovery step executed before restarting the old software.

24. A state copying method for a computation system with at least two logic partitions, comprising the steps of:

updating a state of new software in a standby partition means to a state of old software in an executing partition means while continuing execution of the old software;

switching to execution of new software as far as a same state is achieved for the standby partition means and the executing partition means;

wherein the updating step also comprises an initialization step executed in parallel and without disturbance of the old software running in the executing partition means, and data is scalably transferred from the executing memory partition means to the standby memory partition means.

25. A state copying method according to claim 24, wherein the initialization step is either carried out immediately after loading the new software into the standby partition means or as soon as possible in case it is dependent on data from old software.

26. A state copying method for a computation system having at least two logic partitions, comprising the steps of:

updating a state of new software in a standby partition means to a state of old software in an executing partition means while continuing execution of the old software; and switching to execution of new software as far as a same state is achieved for the standby partition means and the executing partition means;

wherein the updating step is executed repeatedly as background process software to keep track of a changing state in the executing partition means, and data is scalably transferred from the executing memory partition means to the standby memory partition means.

27. A state copying method for a computation system having at least two logic partitions, comprising the steps of:

updating a state of new software in a standby partition means to a state of old software in an executing partition means while continuing execution of the old software; and switching to execution of new software as far as a same state is achieved for the standby partition means and the executing partition means, wherein the updating step is repeatedly executed in parallel with an initialization step, and data is scalably transferred from the executing memory partition mean,s to the standby memory partition means.

28. A state copying method for a distributed computation environment comprising one main processor means and at least one remote processor means, comprising the steps of:

updating new software into a first memory partition means of the remote processor means;

updating a state of the new software to achieve a match with a state of the main processor means while continuing execution of software in the main processor means, wherein data is scalably transferred between the first memory partition means and a second memory partition means; and switching the execution of software in the remote processor means to the new software as soon as a match with the state of the main processor means is achieved.

29. State copying method according to claim 28, wherein further hardware components connected to the remote processor means are exchanged by blocking out the hardware components to be exchanged, then replacing them and finally deblocking them.

* * * * *